(12) United States Patent
Yoshida

(10) Patent No.: US 10,362,693 B2
(45) Date of Patent: Jul. 23, 2019

(54) ELECTRONIC APPARATUS, ELECTRONIC APPARATUS MANUFACTURING METHOD, AND DIE

(71) Applicant: Toshiba Memory Corporation, Tokyo (JP)

(72) Inventor: Kazuhiro Yoshida, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/901,497

(22) Filed: Feb. 21, 2018

(65) Prior Publication Data

US 2018/0249585 A1 Aug. 30, 2018

(30) Foreign Application Priority Data

Feb. 24, 2017 (JP) .................. 2017-033941

(51) Int. Cl.
| | |
|---|---|
| H05K 5/00 | (2006.01) |
| H05K 1/18 | (2006.01) |
| H05K 5/03 | (2006.01) |
| H05K 5/04 | (2006.01) |
| H05K 5/02 | (2006.01) |
| G11C 5/00 | (2006.01) |
| B22C 9/06 | (2006.01) |

(52) U.S. Cl.
CPC ............ *H05K 5/0052* (2013.01); *G11C 5/00* (2013.01); *H05K 1/181* (2013.01); *H05K 5/0004* (2013.01); *H05K 5/006* (2013.01); *H05K 5/0008* (2013.01); *H05K 5/0247* (2013.01); *H05K 5/03* (2013.01); *H05K 5/04* (2013.01); *B22C 9/06* (2013.01); *H05K 2201/10159* (2013.01); *H05K 2201/10189* (2013.01); *H05K 2201/10409* (2013.01); *H05K 2201/10522* (2013.01)

(58) Field of Classification Search
CPC ...................................................... H05K 5/00
See application file for complete search history.

(56) References Cited

U.S. PATENT DOCUMENTS

| | | | |
|---|---|---|---|
| 7,517,231 B2 | 4/2009 | Hiew et al. | |
| 8,687,377 B2 | 4/2014 | Harashima et al. | |
| 2011/0199748 A1* | 8/2011 | Kagawa | H05K 7/20436 361/796 |

FOREIGN PATENT DOCUMENTS

JP 2011-170566 A 9/2011

\* cited by examiner

*Primary Examiner* — Jerry Wu
(74) *Attorney, Agent, or Firm* — Kim & Stewart LLP

(57) ABSTRACT

An electronic apparatus includes a base that includes a flat portion and a side wall provided upright on a part of an outer edge of the flat portion, a printed circuit board disposed in the base and including a device, and a cover covering the base. The base includes a hole that is contiguous to the side wall and provided in the flat portion, a support portion, one end of the support portion being supported by the side wall, and a positioning member provided on the support portion and positioning the cover with respect to the base.

14 Claims, 13 Drawing Sheets

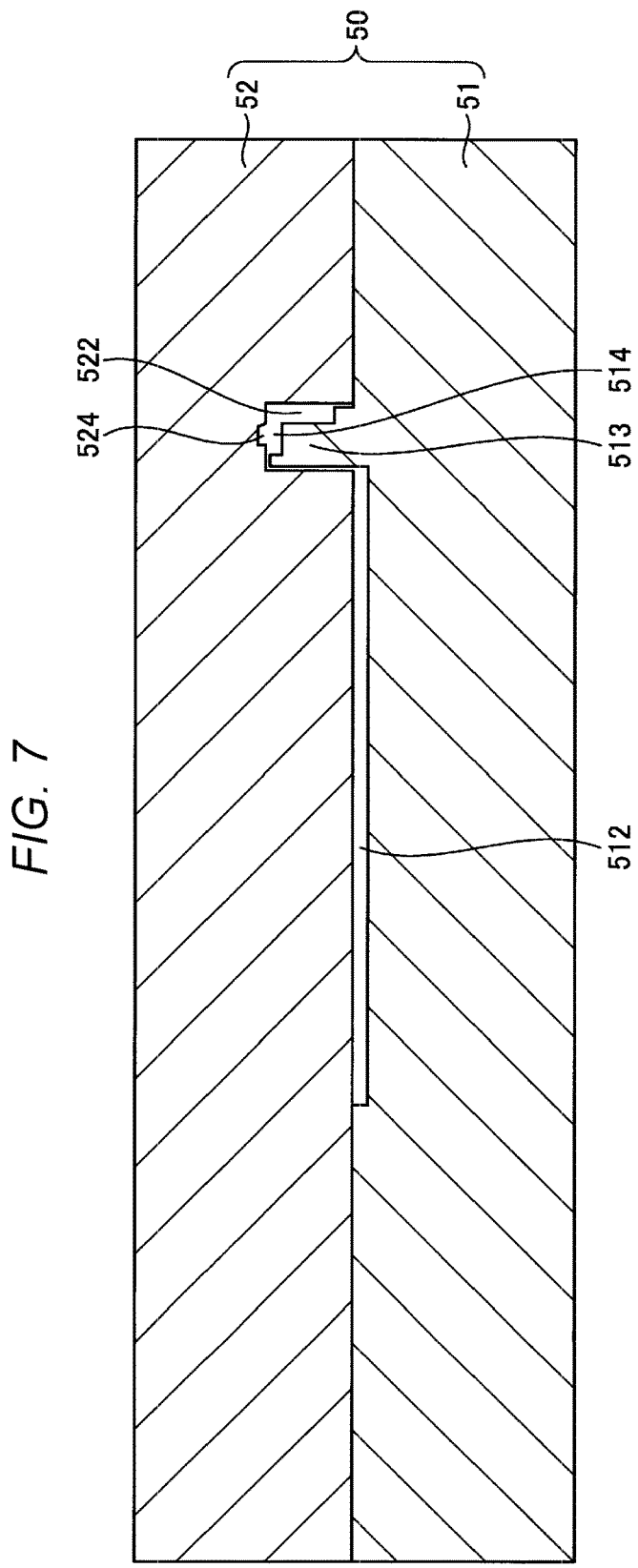

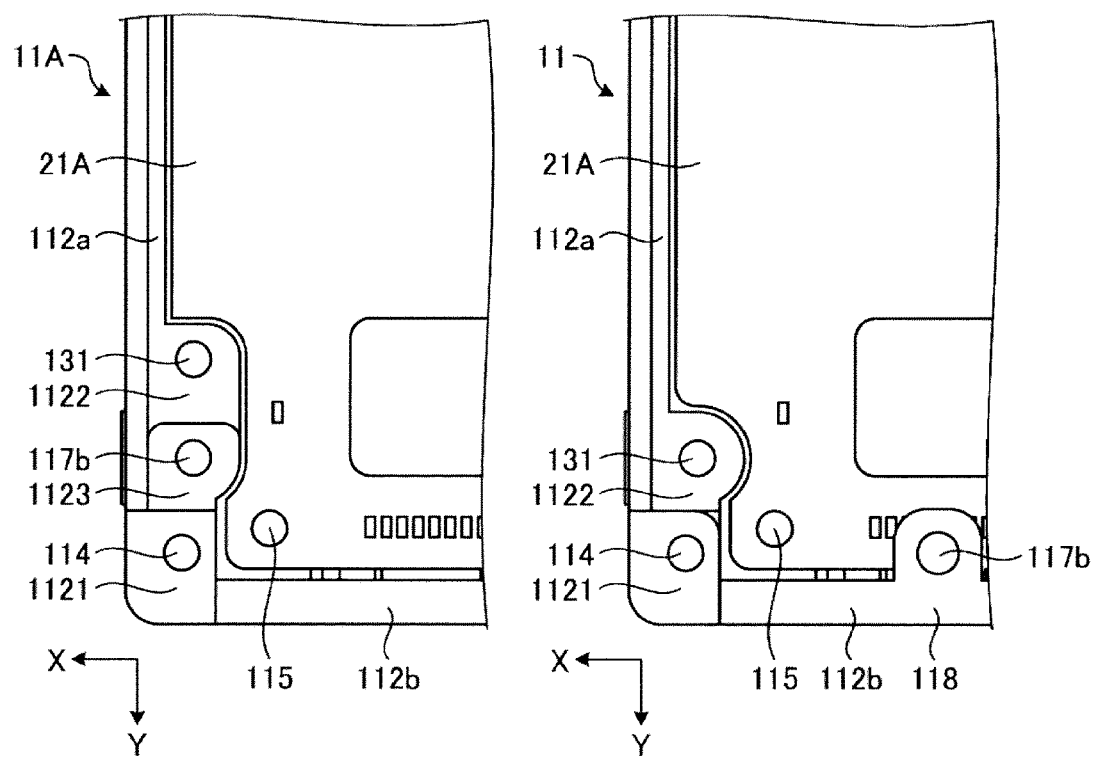

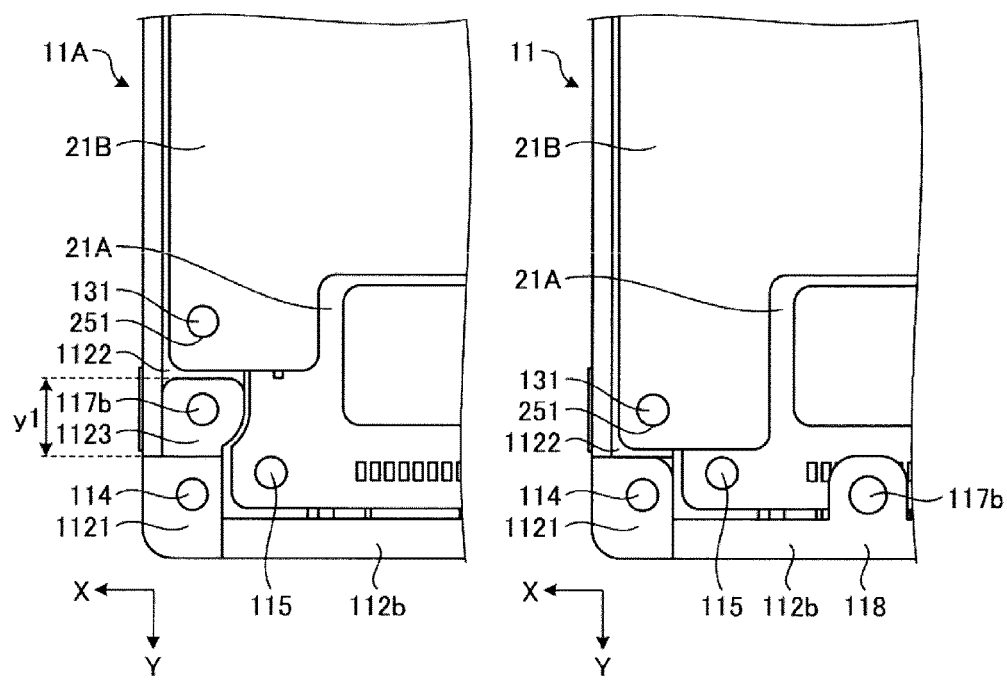

ELECTRONIC APPARATUS, ELECTRONIC APPARATUS MANUFACTURING METHOD, AND DIE

This application is based upon and claims the benefit of priority from Japanese Patent Application No. 2017-033941, filed Feb. 24, 2017, the entire contents of which are incorporated herein by reference.

FIELD

Embodiments described herein relate generally to an electronic apparatus, an electronic apparatus manufacturing method, and a die.

BACKGROUND

In a semiconductor memory device of the related art, a substrate is disposed within a casing. The casing includes a base that has a rectangular bottom wall and a side wall provided upright on an outer edge of the bottom wall, and a cover that covers an upper surface of the base. A positioning pin protruding in a direction toward the cover is disposed on an upper surface of the side wall of the base so that the base can be correctly positioned with respect to the cover.

According to the technique of the related art, however, a thickness of the side wall at a position at which the positioning pin is disposed is larger than that in other positions. Because of this, an area of the substrate disposed within the casing is reduced by as much as an area of a portion of the side wall in which the positioning pin is disposed.

DESCRIPTION OF THE DRAWINGS

FIG. 7 is a cross-sectional view of dies for forming the base according to the first embodiment in a combined state.

FIGS. 9A and 9B are partial top views illustrating states in which a printed circuit board is disposed on the base according to the comparative example and the first embodiment, respectively.

FIGS. 10A and 10B are partial top views illustrating states in which a plurality of printed circuit boards are disposed on the base according to the comparative example and the first embodiment, respectively.

DETAILED DESCRIPTION

Embodiments provide an electronic apparatus, an electronic apparatus manufacturing method, and a die capable of increasing an area of a substrate disposed within a casing, compared with the technique of the related art.

In general, according to one embodiment, there is provided an electronic apparatus including a base that includes a flat portion and a side wall provided upright on a part of an outer edge of the flat portion, a printed circuit board disposed in the base and including a device, and a cover covering the base. The base includes a hole that is contiguous to the side wall and provided in the flat portion, a support portion, one end of the support portion being supported by the side wall, and a positioning member provided on the support portion and positioning the cover with respect to the base.

An electronic apparatus, an electronic apparatus manufacturing method, and a die according to embodiments will be described hereinafter in detail with reference to the accompanying drawings. It is noted that the embodiments given below are not intended to limit the present disclosure.

Figure 1A:
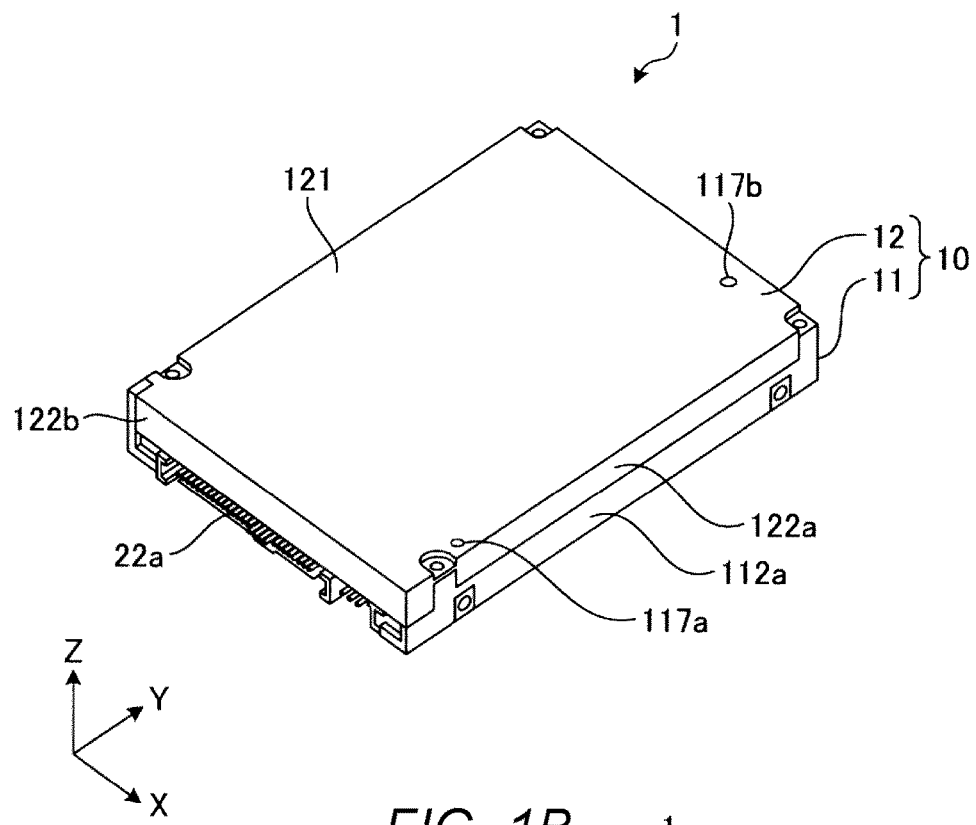
FIGS. 1A and 1B are perspective views illustrating an example of an exterior configuration of an electronic apparatus according to a first embodiment.
Figure 1B:
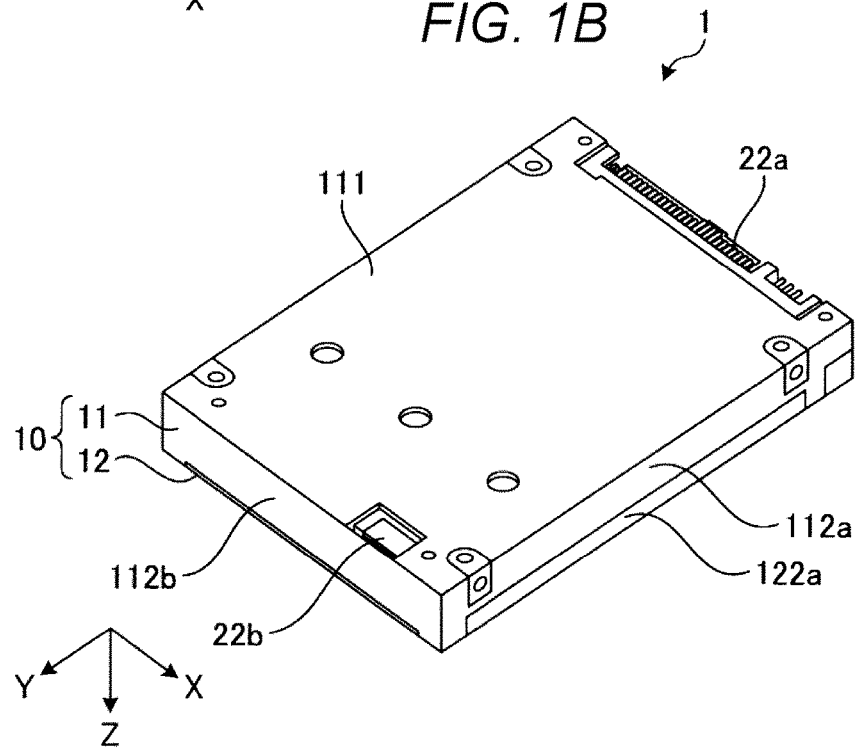
Figure 2:
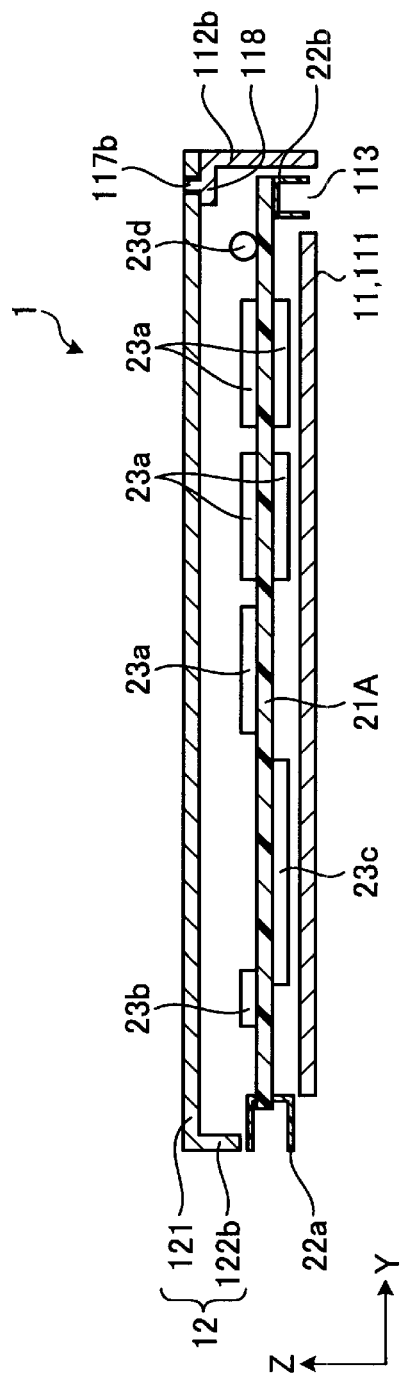
FIG. 2 is a cross-sectional view illustrating an example of an internal configuration of the electronic apparatus according to the first embodiment.
Figure 3:
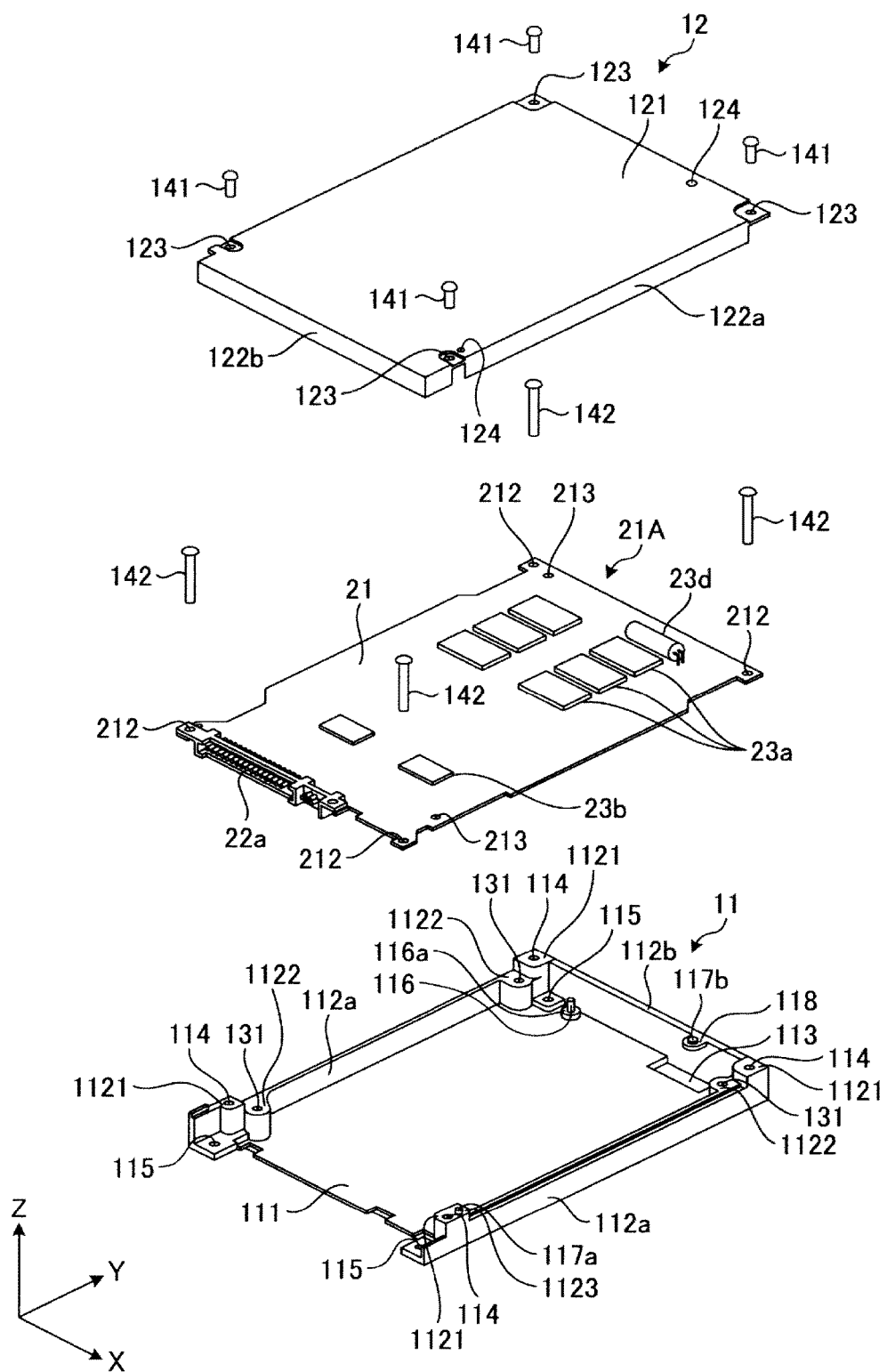
FIG. 3 is an exploded perspective view illustrating an example of the electronic apparatus according to the first embodiment.
Figure 4:
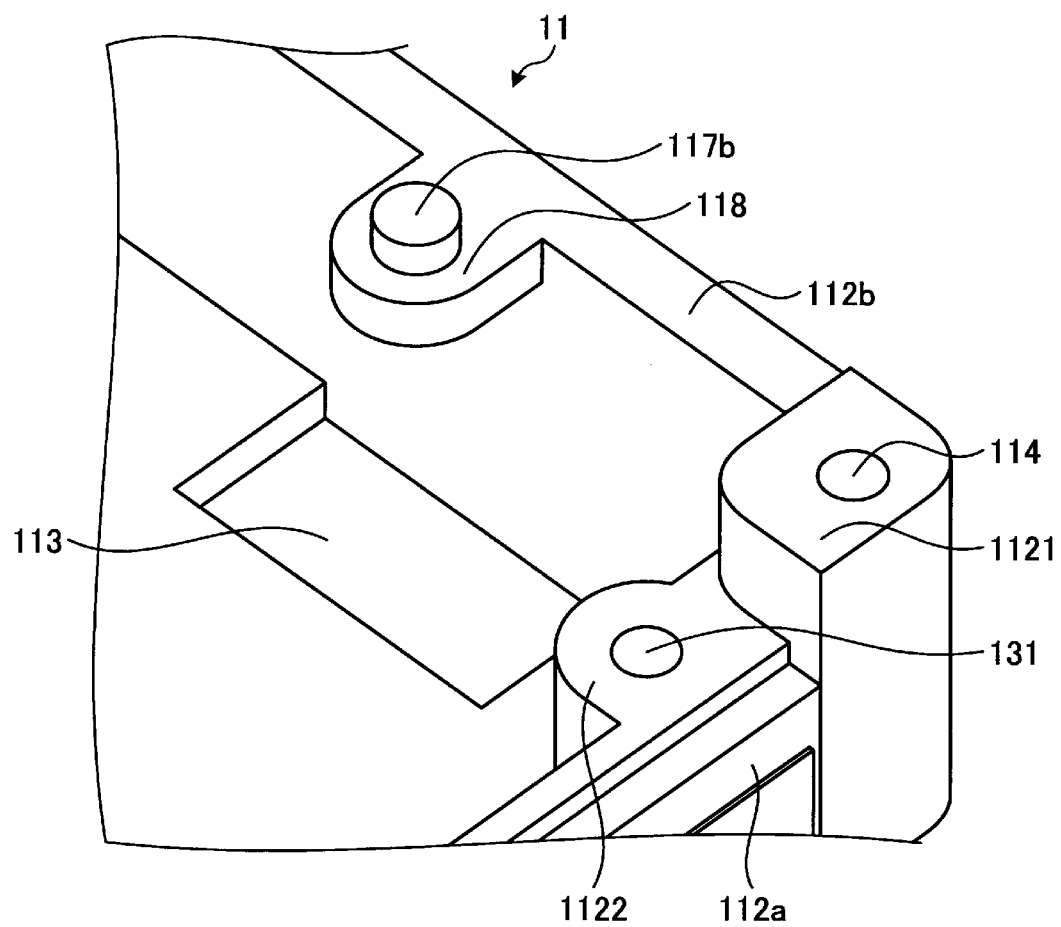
FIG. 4 is a perspective view of an enlarged hole section of a base.
Figure 5:
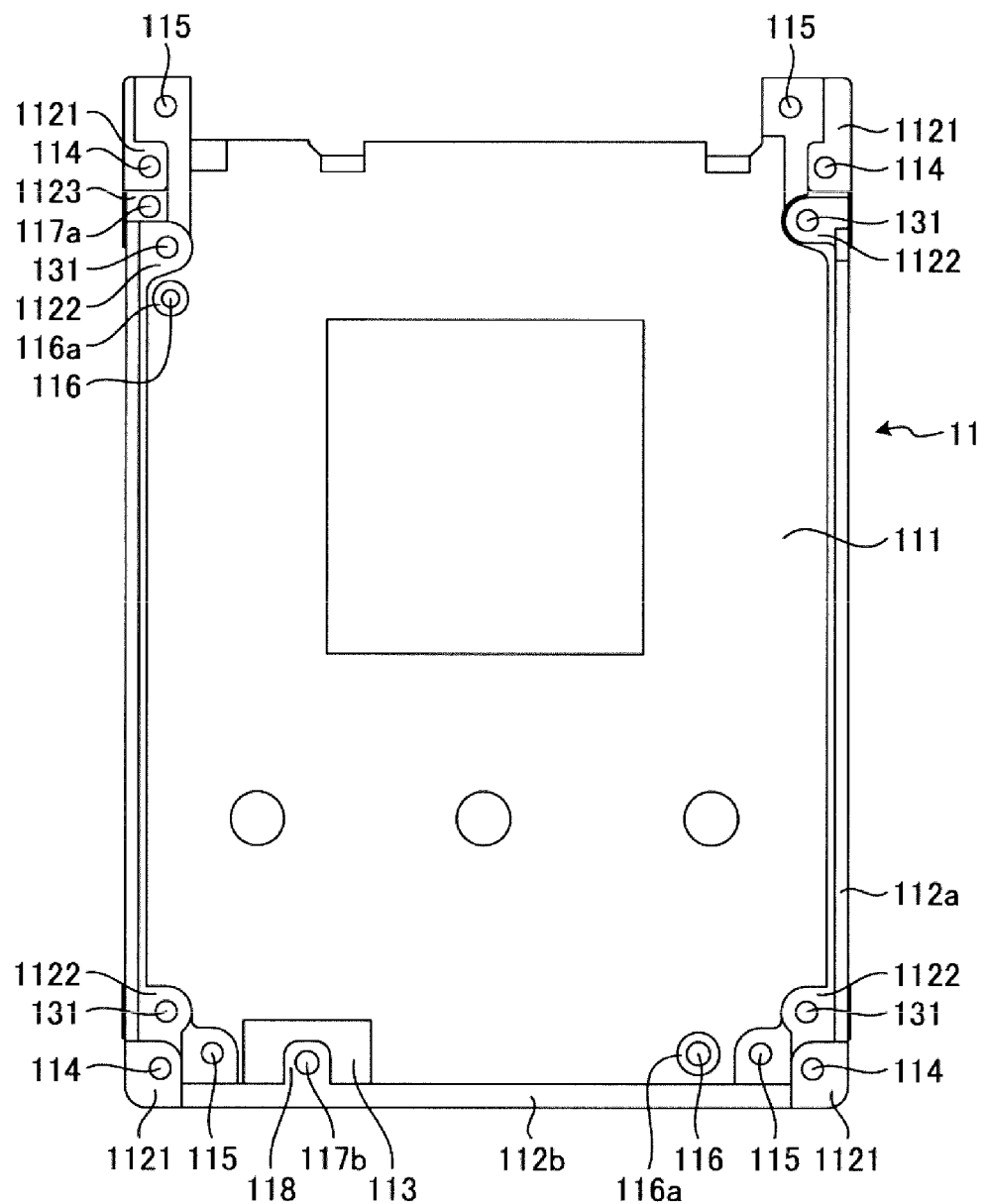
FIG. 5 is a top view of the base according to the first embodiment.

(First Embodiment) FIGS. 1A and 1B are perspective views illustrating an example of an exterior configuration of an electronic apparatus according to a first embodiment. FIG. 1A is the perspective view from an upper surface side and FIG. 1B is the perspective view from a lower surface side. FIG. 2 is a cross-sectional view illustrating an example of an internal configuration of the electronic apparatus according to the first embodiment. FIG. 3 is an exploded perspective view illustrating an example of the electronic apparatus according to the first embodiment. FIG. 4 is a perspective view of an enlarged hole section of a base. FIG. 5 is a top view of the base according to the first embodiment. It is noted that an SSD (Solid State Drive) using a nonvolatile memory as a storage medium will be described as an electronic apparatus 1 hereinafter by way of example. Furthermore, for the sake of convenience, it is assumed that a short length direction of a rectangular top surface or bottom surface of the electronic apparatus 1 is an X direction, a longitudinal direction thereof is a Y direction, and a thickness direction thereof is a Z direction. Moreover, a relative positional relationship among constituent elements disposed in the Z direction, that is, a vertically-structured relationship with reference to a disposed state of the electronic apparatus 1 shown in FIGS. 1A and 2 will be described hereinafter.

The electronic apparatus 1 has a flattened rectangular parallelepiped-shaped exterior. The electronic apparatus 1 includes a casing 10 of a hollow rectangular parallelepiped shape, and one or more substrates, that is, one or more printed circuit boards 21 stored in the casing 10.

The casing 10 includes a base 11 and a cover 12. The base 11 has a flat bottom wall 111 that is a rectangular flat portion, and side walls 112a and 112b standing upright on an outer edge of the bottom wall 111 upward in the Z direction (at an angle perpendicular to a plane of the flat bottom wall 111). In this example, a pair of side walls 112a each having a surface perpendicular to the X direction and one side wall 112b provided in one end portion in the Y direction and having a surface perpendicular to the Y direction are provided. In this way, the base 11 is an open container that has a generally bathtub structure in which the surfaces in the Z direction and the surface in the one end portion in the Y direction, all of which face the bottom wall 111, are open.

A hole 113 is provided in a part of the base 11. The hole 113 is provided in the bottom wall 111 contiguous to (or adjacent to) either the side wall 112a or the side wall 112b. The hole 113 may be provided in the bottom wall 111 contiguous to (or adjacent to) the entire side wall 112a or side wall 112b. In this example, the hole 113 for a connector interface is provided at a position at which a connector 22b provided on the printed circuit board 21A is exposed. The connector 22b can be, for example, a debugging connector.

Screw holes 114 extending in the Z direction are provided in upper surfaces of the side walls 112a and 112b. A portion in which each screw hole 114 is provided serves as a seat portion 1121 in which a thickness of the side wall 112a or 112b is larger than that in other portions. The screw holes 114 are provided to fix the cover 12 covering the base 11 by screws 141. In this example, the seat portions 1121 are provided on the side walls 112a and 112b near four corners of the rectangular bottom wall 111.

Furthermore, screw holes 131 extending in the Z direction are provided in the side walls 112a. A portion in which each screw hole 131 is provided serves as a seat portion 1122 in which the thickness of the side wall 112a is larger than that in other portions. The screw holes 131 are provided to fix an upper printed circuit board disposed to the base 11 by the screws when two printed circuit boards are accommodated in the casing 10. Because of this, a height of each seat portion 1122 is set smaller than that of each seat portion 1121. In this example, the four seat portions 1122 are provided near the four seat portions 1121, respectively.

Screw holes 115 are provided in the bottom wall 111 of the base 11. The screw holes 115 are provided to fix the printed circuit board 21A to the base 11 by fixtures such as screws 142. In addition, a plurality of pins 116 are provided on the bottom wall 111 of the base 11 for positioning the printed circuit board 21A with respect to the base 11 in the X and Y directions. The pins 116 are provided on seat portions 116a provided on the bottom wall 111 to protrude upward in the Z direction. Through-holes 213 through which the respective pins 116 pass are provided at positions, which correspond to the pins 116, of the printed circuit board 21A.

A plurality of pins are provided on the side walls 112a and 112b for positioning the cover 12 with respect to the base 11 in the X and Y directions when the cover 12 is covered on the base 11. This example illustrates that two pins 117a and 117b are provided as the plurality of pins.

The pin 117a is provided on the side wall 112a near one of the screw holes 114 on a side on which a communication connector 22a is disposed. The pin 117a is positioned to extend upward in the Z direction (that is, toward the cover 12). A position at which the pin 117a is disposed is a position of a seat portion 1123 in which the thickness of the side wall 112a is larger than that in other positions.

Furthermore, the pin 117b is disposed in a support portion 118 which is disposed in an upper space of a position of the hole 113, which is provided integrally across the bottom wall 111 from a part of the side wall 112b and which has one end supported by the side wall 112b. The support portion 118 is provided on the side wall 112b above the position of the hole 113 to protrude toward an inner side of the base 11. In addition, the support portion 118 is disposed not to protrude beyond the hole 113 when viewed from the Z direction. That is, dimensions of the support portion 118 in the X direction and the Y direction are smaller than dimensions of the hole 113, which is provided in the bottom wall 111, in the X direction and the Y direction. Through-holes 124 through which the respective pins 117a and 117b pass are provided at positions which correspond to the pins 117a and 117b, of the cover 12.

The cover 12 includes a rectangular flat top wall 121 and side walls 122a and 122b standing upright on an outer edge of the top wall 121 downward in the Z direction. In this example, a pair of side walls 122a each having a surface perpendicular to the X direction and one side wall 122b having a surface perpendicular to the Y direction are provided. The side wall 122b is provided on aside on which the communication connector 22a is disposed when the cover 12 is placed on the base 11.

Through-holes 123 through which screws 141 pass and the through-holes 124 through which the pins 117a and 117b provided on the base 11 pass are provided in the cover 12. The through-holes 123 through which the screws 141 pass are provided at positions corresponding to the screw holes 114 of the base 11. In addition, the through-holes 124 through which the pins 117a and 117b pass are provided at positions corresponding to the pins 117a and 117b of the base 11.

The base 11 and the cover 12 constituting the casing 10 are configured from a material having good thermal conductivity. Examples of the material having the good thermal conductivity include an aluminum alloy, stainless steel, and copper alloy. Further, a film of a material having high heat dissipation performance may be formed on each of surfaces of the base 11 and the cover 12. Specifically, such a film can be formed by applying a paint containing a filler having high heat dissipation performance (for example, ceramic particles for an insulator, and metal particles, carbon fibers or the like for a thermal conductor).

The printed circuit board 21A has a configuration such that the communication connector 22a is disposed in one end portion of a printed wiring board 21 in the Y direction and the debugging connector 22b is disposed in the other end portion thereof, and that devices are mounted on the printed wiring board 21. The devices include nonvolatile memory chips 23a, a volatile memory chip 23b, a controller chip 23c, a capacitor 23d, and the like. Examples of the nonvolatile memory chips 23a include a nonvolatile semiconductor memory using a NAND flash memory. Examples of the volatile memory chip 23b include a DRAM (Dynamic Random Access Memory) and an SRAM (Static Random Access Memory). The controller chip 23c controls the nonvolatile memory chips 23a and the volatile memory chip 23b. The controller chip 23c is configured from, for example, an SoC (System-on-a-Chip). The capacitor 23d functions to compensate for supply of electric power from a host apparatus to which the electronic apparatus 1 is connected.

The controller chip 23c controls transmission and reception of data between the electronic apparatus 1 and the host apparatus. Specifically, when receiving a data write command from the host apparatus, the electronic apparatus 1 temporarily stores write data in a write buffer provided in the volatile memory chip 23b and writes the data in the write buffer to a position in nonvolatile memory chips 23a corresponding to a designated address. Furthermore, when receiving a data read command from the host apparatus, the electronic apparatus 1 reads data from a position of nonvolatile memory chips 23a corresponding to a designated address, and temporarily stores the read data in a read buffer provided in the volatile memory chip 23b. The electronic apparatus 1 outputs the data stored in the read buffer to the host apparatus.

Moreover, the controller chip 23c controls transmission and reception of data between the electronic apparatus 1 and the host apparatus to which the electronic apparatus 1 is connected via the communication connector 22a under a standard such as SATA (Serial Advanced Technology Attachment), SAS (Serial Attached Small Computer System Interface) or PCIe® (Peripheral Component Interconnect express). Examples of the host apparatus include a personal computer, a portable computer, a server apparatus, and a mobile communication apparatus. Further, the controller chip 23c controls transmission and reception of data between the electronic apparatus 1 and a debugging apparatus via the debugging connector 22b under a standard such as RS (Recommended Standard)-232C.

The devices are mounted on at least one of two principal surfaces of the printed circuit board 21A by means of, for example, surface mounting. In this example, the nonvolatile memory chips 23a and the controller chip 23c are disposed on a lower surface of the printed circuit board 21A, while the nonvolatile memory chips 23a and the volatile memory chip 23b are disposed on an upper surface of the printed circuit board 21A.

While FIG. 3 illustrates an example in which one printed circuit board 21A is accommodated in the casing 10, a printed circuit board group having a plurality of printed circuit boards stacked at predetermined intervals in the Z direction may be accommodated in the casing 10. In this case, the printed circuit boards contiguous in the Z direction are electrically connected to each other by board-to-board connectors. The board-to-board connectors are surface-mounted on the respective printed circuit boards. The board-to-board connectors are provided at positions of facing each other when the plurality of printed circuit boards are positioned and superposed. One of the connectors is a male connector and the other connector is a female connector; therefore, fitting the two connectors in each other establishes electrical connection between the plurality of printed circuit boards.

A method of assembling such an electronic apparatus 1 will be described with reference to FIG. 3. First, the devices including the nonvolatile memory chips 23a, the volatile memory chip 23b, and the controller chip 23c is surface-mounted on the printed wiring board 21 and the capacitor 23d is soldered thereto, thereby forming the printed circuit board 21A.

Next, the pins 116 of the base 11 are positioned with respect to the through-holes 213 of the printed circuit board 21A so that the through-holes 213 are fitted in the pins 116, thereby placing the printed circuit board 21A on the base 11. The printed circuit board 21A is then fixed to the base 11 by the fixtures such as the screws 142. That is, the printed circuit board 21A is fixed to the base 11 in such a manner that the screws 142 pass through the through-holes 212 of the printed circuit board 21A and are fitted in the screw holes 115 of the base 11.

Subsequently, the pin 117a provided on the side wall 112a of the base 11 and the pin 117b provided on the support portion 118 above the hole 113 are positioned with respect to the through-holes 124 of the cover 12 so that the through-holes 124 are fitted in the pins 117a and 117b, thereby placing the cover 12 on the base 11. The cover 12 is then fixed to the base 11 by fixtures such as the screws 141. That is, the cover 12 is fixed to the base 11 in such a manner that the screws 141 pass through the through-holes 123 provided in the cover 12 and are fitted in the screw holes 114 provided in the seat portions 1121 of the base 11. Through processes described so far, the electronic apparatus 1 is assembled.

A method of manufacturing such a base 11 will next be described. The base 11 is a casting made by metal casting.

Figure 6A:
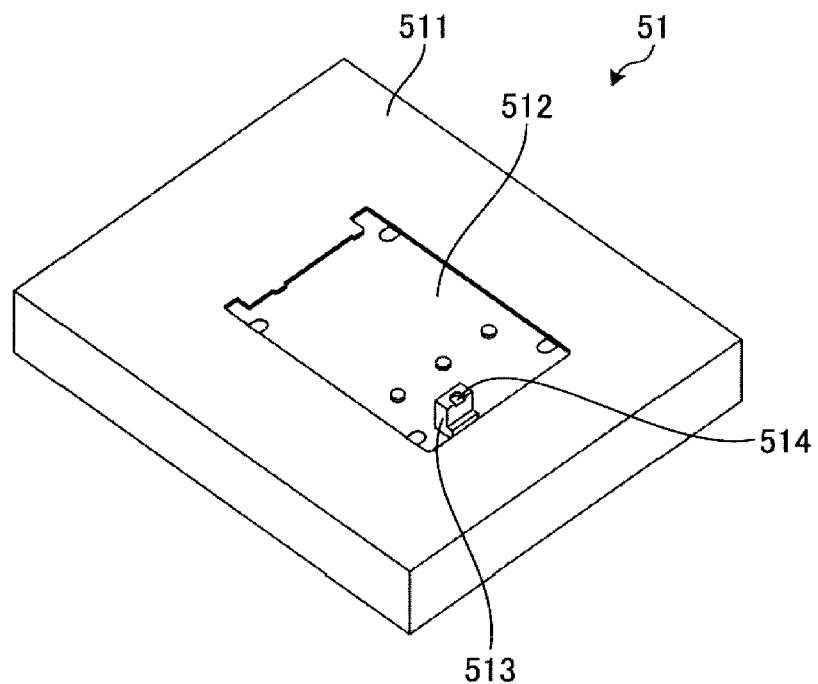
FIGS. 6A and 6B are perspective views illustrating an example of a configuration of a couple of dies for forming the base according to the first embodiment.
Figure 6B:
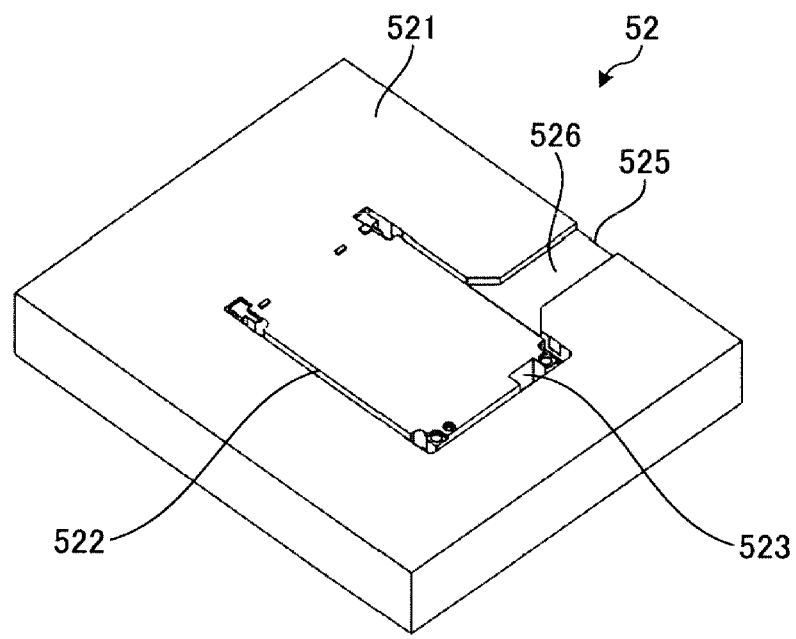

FIGS. 6A and 6B are perspective views illustrating an example of a configuration of a die for forming the base according to the first embodiment. FIG. 7 is a cross-sectional view of dies for forming the base according to the first embodiment in a combined state.

A die 50 includes a die 51 that is a first die member and a die 52 that is a second die member. The die 51 is configured such that an uneven portion (e.g., non-planar surface) 512 that shapes the bottom wall 111 of the base 11 is provided in a rectangular parallelepiped-shaped metal piece 511. Furthermore, a protruding portion 51 for forming the hole 113 is provided at a position corresponding to the hole 113. A recess portion 514 for forming a lower surface side of the support portion 118 is provided in an upper portion of the protruding portion 513. As shown in FIG. 7, the recess portion 514 is connected to a groove 522 provided in the die 52.

The die 52 is configured such that an uneven portion that shapes the side walls 112a and 112b of the base 11 is provided in a rectangular parallelepiped-shaped metal piece 521. The groove 522 for forming the side walls 112a and 112b is provided herein along an outer edge of a formation position of the bottom wall 111. Furthermore, a recess portion 523 corresponding to the protruding portion 513 of the die 51 is provided at a position corresponding to the hole 113. A lower surface of the recess portion 523 in a direction into the sheet of FIG. 6B forms an upper surface of the support portion 118. Moreover, a recess portion 524 (not shown in FIGS. 6A and 6B but shown in FIG. 7) for forming the pin 117b is provided in a lower portion of the recess portion 523 in the direction of the sheet of FIG. 6. Further, a gate 525 and a runner 526 are provided in the die 52.

As shown in FIG. 7, when the dies 51 and 52 are combined with each other in a state in which surfaces, on which the uneven portions 512 and grooves 522 are formed, face each other, a cavity identical to a shape to the base 11 is formed. When molten metal flows from the gate 525, the molten metal passes through the runner 526 and flows into the cavity. The cavity is filled with the molten metal. Subsequently, when a cooling mechanism (not shown) provided in the dies 51 and 52 cools the molten metal within the cavity and the dies 52 and 51 are separated from each other, the base 11 is formed.

At this time, as shown in FIGS. 2 to 5, the support portion 118 protrudes toward the inner side of the base 11 from the side wall 112b and is in a state of being overhung (e.g., cantilevered) with respect to the bottom wall 111. The bottom wall 111, however, is not present below the support portion 118 in the Z direction. Because of this, the protruding portion 513 is provided in a portion of the die 51 corresponding to a portion in which the bottom wall 111 is not present and a cavity is formed in this protruding portion 513 for forming the support portion 118. It is thereby possible to form the base 11 including the support portion 118 of an overhung structure simply by separating the couple of dies 52 and 51 from each other in the Z direction.

Figure 8:
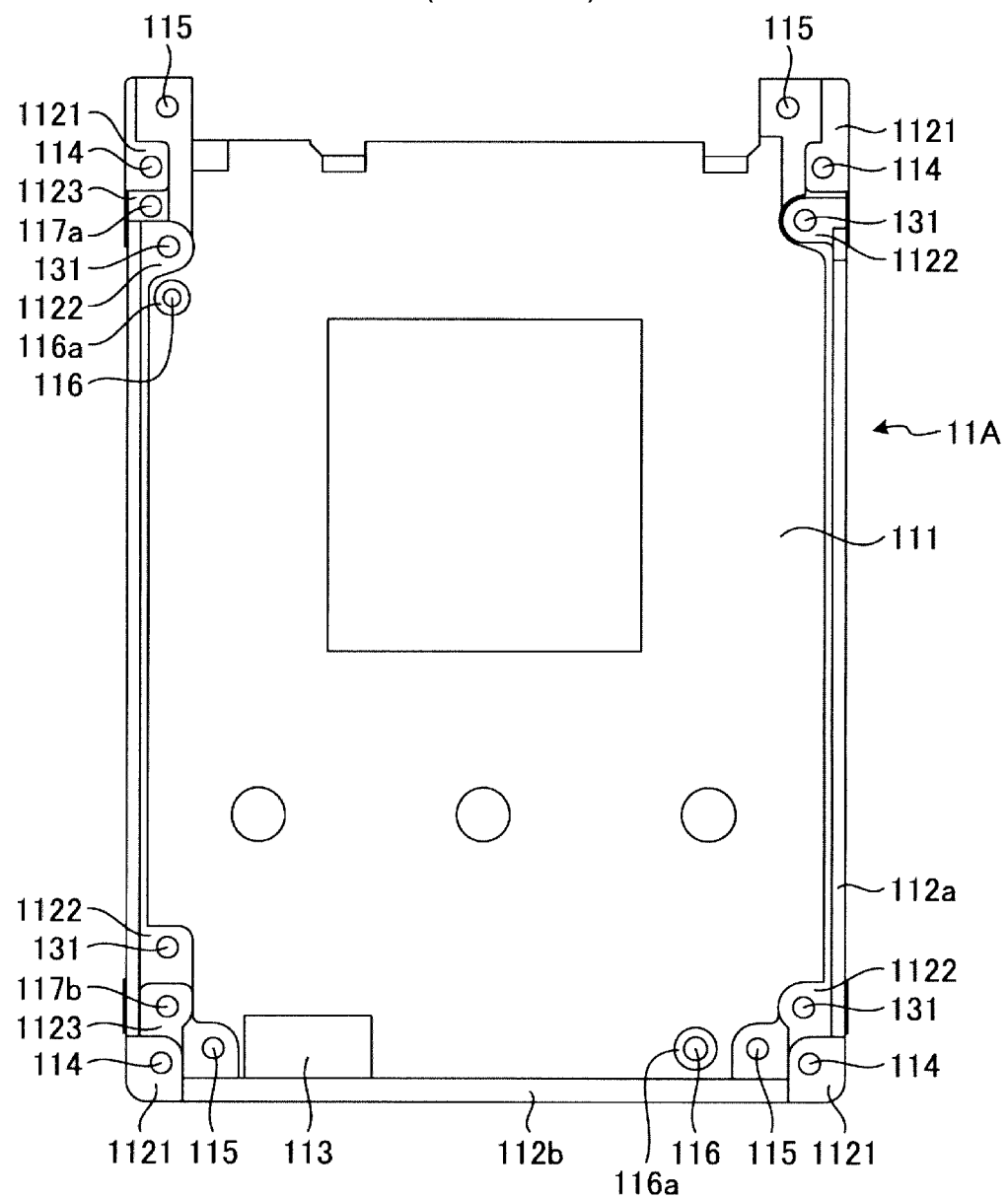
FIG. 8 is a top view illustrating a configuration of a base according to a comparative example of the first embodiment.

Next, advantages of the electronic apparatus 1 according to the first embodiment as compared with a comparative example will be described. FIG. 8 is a top view illustrating a configuration of a base according to the comparative example. FIGS. 9A and 9B are partial top views illustrating states in which the printed circuit board is disposed on the base according to the comparative example and the first embodiment, respectively. FIG. 9A illustrates a case of using the base according to the comparative example whereas FIG. 9B illustrates an example of using the base according to the first embodiment. FIGS. 10A and 10B are partial top views illustrating states in which a plurality of printed circuit boards are disposed on the base according to the comparative example and the first embodiment, respectively. FIG. 10A illustrates a case of using the base according to the comparative example of FIG. 8 whereas FIG. 10B illustrates an example of using the base according to the first embodiment of FIG. 5.

As shown in FIG. 8, abase 11A according to the comparative example is configured such that the pins 117a and 117b for positioning the cover 12 are provided on the respective seat portions 1123 of one side wall 121a. The seat portions 1123 are each formed such that a width of the side wall 112a is set larger than that in other portions, and the pins 117a and 117b are provided on upper surfaces of the respective seat portions 1123. It is noted that same constituent elements as those described previously are denoted by the same reference signs and description thereof is omitted for brevity.

On the other hand, as shown in FIG. 5, the base 11 according to the first embodiment is configured such that the pin 117a is provided at a similar position to that in FIG. 8 but the pin 117b is provided on the support portion 118 disposed above the hole 113. That is, the pin 117b provided on the seat portion 1123 near one corner portion in FIG. 8 is moved, in FIG. 5, onto the support portion 118 disposed above the hole 113.

FIG. 9A illustrates a state in which the printed circuit board 21A is placed on the base 11A shown in FIG. 8. As shown in FIG. 9A, an outer shape of the printed circuit board 21A is determined in accordance with uneven portions inside of each side wall 112a of the base 11A. In FIG. 9A, the outer shape of the printed circuit board 21A is determined such that the printed circuit board 21A does not contact the seat portion 1122 in which each screw hole 131 for fixing a second printed circuit board is disposed and the seat portion 1123 in which the pin 117b for positioning the cover 12 is disposed.

On the other hand, FIG. 9B illustrates a state in which the printed circuit board 21A is placed on the base 11 shown in FIG. 5. In the base 11 shown in FIG. 5, the pin 117b for positioning the cover 12 provided in one corner portion and the seat portion 1123 supporting the pin 117b are eliminated and the pin 117b is moved onto the support portion 118. Because of this, as compared with the case of FIG. 9A, it is possible to increase an area of the printed circuit board 21A by as much as an area generally identical to an area of the seat portion 1123. As a result, as compared with the case of FIG. 9A, it is advantageously possible to increase the number of devices that can be disposed on the printed circuit board 21A.

Alternatively, a plurality of printed circuit boards 21A and 21B can be disposed on the base 11 or 11A at predetermined intervals in the Z direction. FIG. 10A illustrates a state in which the second printed circuit board 21B is further disposed on an upper side in the Z direction subsequently to a state of FIG. 9A. The second printed circuit board 21B is disposed on the printed circuit board 21A by board-to-board connectors (not shown). The printed circuit board 21B is thereby placed on the base 11A in such a manner that a through-hole 251 of the printed circuit board 21B is located on each screw hole 131.

On the other hand, FIG. 10B illustrates a state in which the second printed circuit board 21B is further disposed on the upper side in the Z direction subsequently to a state of FIG. 9B. The second printed circuit board 21B is disposed on the printed circuit board 21A by board-to-board connectors (not shown). The printed circuit board 21B is thereby placed on the base 11 in such a manner that the through-hole 251 of the printed circuit board 21B is located on each screw hole 131. At this time, the pin 117b for positioning the cover 12 is not disposed near the corner portion; therefore, the seat portion 1122 in which each screw hole 131 for fixing the printed circuit board 21B is disposed, is disposed contiguous to the seat portion 1121 in which the screw hole 114 disposed in one corner portion is disposed. In the example of FIG. 10B, therefore, as compared with the case of FIG. 10A, it is possible to extend a size of the printed circuit board 21B in the Y direction by as much as a size y1 of the seat portion 1123 in the Y direction. As a result, as compared with the case of FIG. 10A, it is possible to increase the number of devices that can be disposed on the printed circuit board 21B.

Figure 11A:
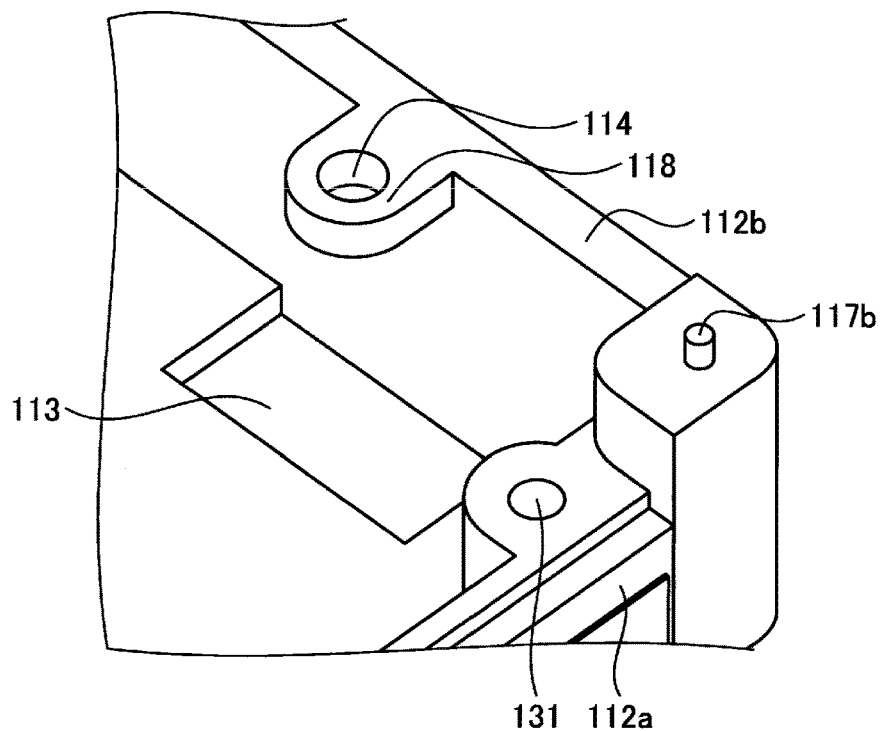
FIGS. 11A and 11B are partial perspective views illustrating other examples of the base according to the first embodiment.
Figure 11B:
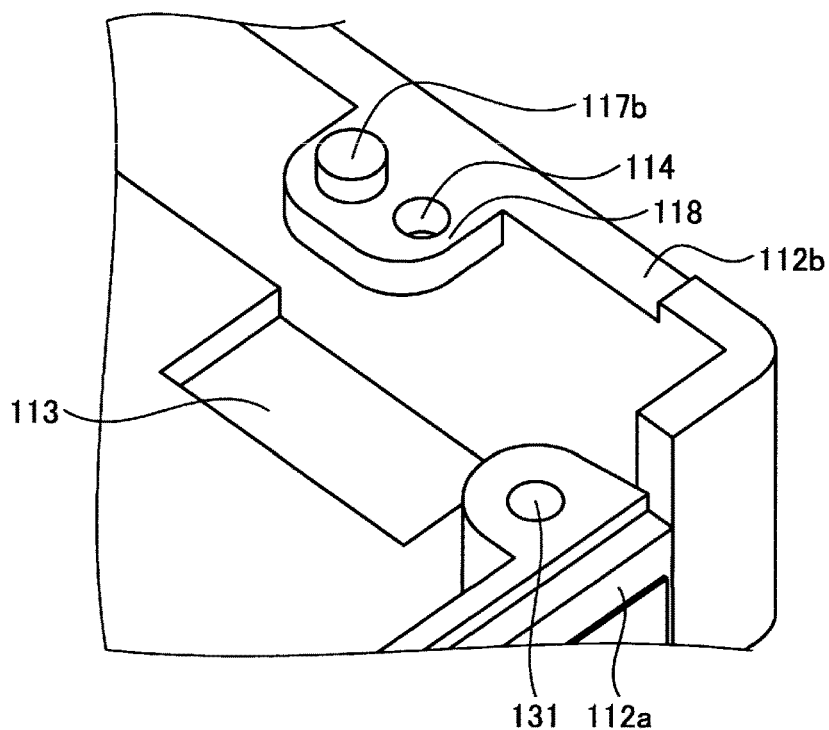

While an example in which the pin 117b for positioning the cover 12 is disposed on the support portion 118 above the hole 113 is described above, the embodiment is not limited to the example. FIGS. 11A and 11B are partial perspective views illustrating other examples of the base according to the first embodiment. As shown in FIG. 11A, the screw hole 114 for fixing the position of the cover 12 disposed at any position in the present embodiment may be disposed on the support portion 118. Specifically, as compared with the case of FIG. 4, a position of the screw hole 114 is interchanged with the position of the pin 117b. In a method of manufacturing the electronic apparatus 1 in this case, the cover 12 is fixed by positioning the cover 12 using the pins 117a and 117b and then inserting the screws 141 into the screw holes 114 provided in the support portion 118 and the seat portions 1121.

Moreover, as shown in FIG. 11B, the screw hole 114 for fixing the position of the cover 12 disposed at any position and the pin 117b for positioning the cover 12 in the present embodiment may be disposed on the support portion 118. Specifically, as compared with the case of FIG. 4, neither the screw hole 114 nor the pin 117b is disposed in one corner portion of the base 11. In a method of manufacturing the electronic apparatus 1 in this case, the cover 12 is fixed by positioning the cover 12 using the pin 117a and the pin 117b that is provided on the support portion 118 and then inserting the screws 141 into the screw holes 114 provided in the support portion 118 and the seat portions 1121.

In the first embodiment, in a case where the hole 113 is provided in the range from the bottom wall 111 of the base 11 to the side wall 112a thereof, the support portion 118 that is located above the hole 113 and that does not protrude beyond the hole 113 in the X and Y directions when being viewed from the Z direction is formed on the side wall 112b. In addition, a positioning member including the pin 117b for positioning the cover 12 or the screw hole 114 for fixing the position of the cover 12 is formed on the support portion 118. It is thereby possible to increase the area of the base 11 surrounded by the side walls 112a and 112b by as much as the area in a situation of providing the pin 117b or the screw hole 114 on the side wall 112a, as compared with the comparative example. In this way, it is possible to increase the area of the printed circuit board 21A that can be placed on the base 11, so that it is advantageously possible to increase the number of devices that can be mounted on the printed circuit board 21A.

(Second Embodiment) The first embodiment discusses the situation in which the support portion is provided above the hole provided in the bottom wall including a boundary portion with the side wall and the positioning member is disposed on this support portion by way of example. A second embodiment discusses an example in which another function is further added to the support portion besides the function according to the first embodiment.

Figure 12:
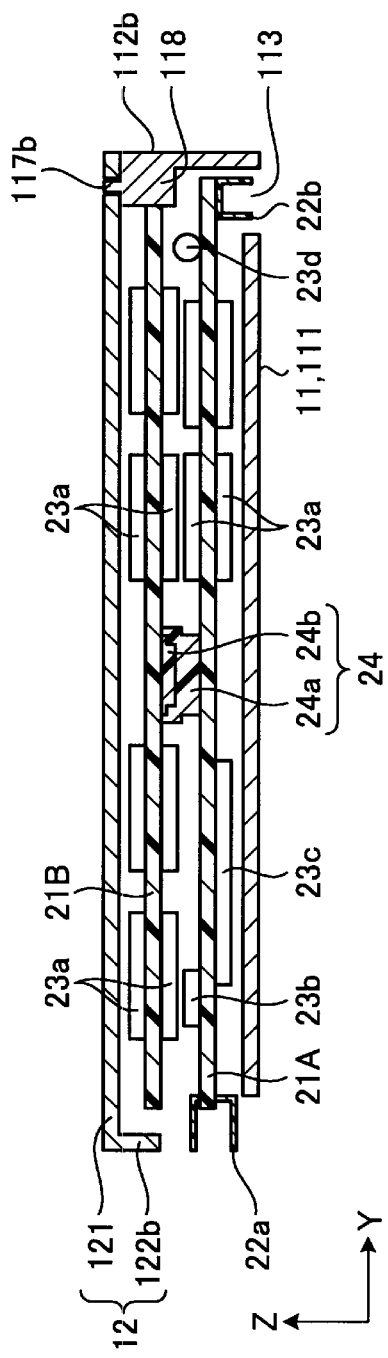
FIG. 12 is a schematic cross-sectional view illustrating an example of a configuration of an electronic apparatus according to a second embodiment.
Figure 13:
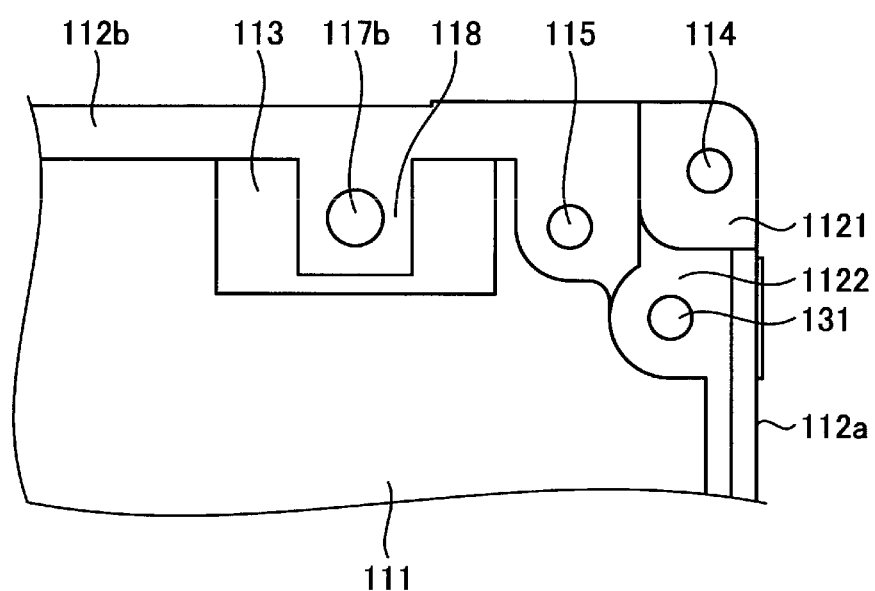
FIG. 13 is a schematic top view illustrating an example of a structure of a support portion of a base according to the second embodiment.

FIG. 12 is a schematic cross-sectional view illustrating an example of a configuration of an electronic apparatus according to the second embodiment. FIG. 13 is a schematic top view illustrating an example of a structure of a support portion of abase according to the second embodiment. The same constituent elements as those in the first embodiment are denoted by the same reference signs and description thereof is omitted for brevity, while constituent elements different from those in the first embodiment will be described hereinafter.

In the second embodiment, the two printed circuit boards 21A and 21B are stacked at predetermined intervals in the Z direction within the casing 10. The two printed circuit boards 21A and 21B are electrically connected to each other by board-to-board connectors 24. In the present embodiment, a female connector 24A is surface-mounted on an upper surface of the lower printed circuit board 21A and a male connector 24b is surface-mounted on a lower surface of the upper printed circuit board 21B. Fitting the two connectors in each other establishes electrical connection between the printed circuit boards 21A and 21B. Further, the printed circuit boards 21A and 21B are relatively tightly connected to each other by connecting the printed circuit boards 21A and 21B by the board-to-board connectors 24.

Moreover, an end portion of the upper printed circuit board 21B in the Y direction contacts the support portion 118 of the base 11. That is, a thickness, in the Z direction, of the support portion 118 is adjusted such that the support portion 118 contacts the upper printed circuit board 21B out of the two printed circuit boards 21A and 21B disposed in the base 11. With this configuration, the support portion 118 functions as a stop which suppresses a positioning error of the printed circuit board 21B in the Y direction within the casing 10.

A shape of the support portion 118 viewed from the Z direction may be a shape having a circular tip end protruding in the Y direction as shown in FIG. 4 according to the first embodiment, or the shape of the support portion 118 viewed from the Z direction may be a rectangular shape as shown in FIG. 13.

Furthermore, when the shape of the support portion 118 viewed from the Z direction is the rectangular shape as shown in FIG. 13, the heat generated in the printed circuit board 21B can be transferred to the casing 10, and an improvement in heat dissipation performance can be provided.

The above description is directed to the example in which the two printed circuit boards 21A and 21B are accommodated in the casing 10 and the upper printed circuit board 21B contacts the support portion 18. However, the present embodiment is not limited to this example. Alternatively, three or more printed circuit boards may be accommodated in the casing 10 and one or a plurality of printed circuit boards present on an upper side may contact the support portion 118.

According to the second embodiment, one end portion of the support portion 118 of the base 11 is brought into contact with the printed circuit board 21B accommodated in the casing 10. As a result, it is advantageously possible to suppress a positioning error of the printed circuit board 21B within the casing 10. Furthermore, it is advantageously possible to transfer the heat generated in the printed circuit board 21B to the casing 10 via the support portion 118 and to facilitate heat dissipation by increasing a contact area between the support portion 118 and the printed circuit board 21B.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. The accompanying claims and their equivalents are intended to cover such forms or modifications as would fall within the scope and spirit of the inventions.

What is claimed is:

1. An electronic apparatus comprising: a base that includes a flat portion and a side wall upright on an outer edge of the flat portion; a printed circuit board disposed in the base and including a device and a connector; and a cover covering the base, wherein the base includes: a hole in the flat portion to receive the connector, the hole being adjacent to side wall; a support portion extending from the side wall towards an interior of the base, the support portion being above the hole; and a positioning member on the support portion comprising a pin and configured to position the cover with respect to the base by engaging the pin with a through-hole on the cover; wherein the support portion and the hole overlap each other when viewed from a vertical direction orthogonal to a plane of the flat portion.

2. The electronic apparatus according to claim 1, further comprising:
a screw fixing the cover to the base, wherein
the positioning member is a screw hole for receiving the screw, and
the cover includes a through-hole at a position corresponding to the screw hole.

3. The electronic apparatus according to claim 1, wherein the support portion overlaps only a portion of the hole.

4. The electronic apparatus according to claim 1, wherein the base is a casting.

5. The electronic apparatus according to claim 1, wherein the base is formed from an aluminum alloy, a stainless steel, or a copper alloy.

6. The electronic apparatus according to claim 1, wherein the connector on the printed circuit board corresponds in position to the hole.

7. The electronic apparatus according to claim 1, wherein the printed circuit board includes a nonvolatile memory chip and a controller chip configured to control the nonvolatile memory chip.

8. The electronic apparatus according to claim 1, wherein the support portion is closer in a vertical direction to the cover than the hole, and is adjacent to a side surface of the printed circuit board.

9. The electronic apparatus according to claim 1, wherein the printed circuit board is at a level along the vertical direction that is between a level of the support portion and a level of the flat portion.

10. The electronic apparatus according to claim 1, wherein the connector on the printed circuit board is between the support portion and the hole along the vertical direction.

11. The electronic apparatus according to claim 1, wherein the printed circuit board is at a level between the support portion and the flat portion along a direction orthogonal to the flat portion.

12. The electronic apparatus according to claim 1, wherein the support portion is cantilevered off the sidewall at position above at least a portion of the hole.

13. The electronic apparatus according to claim 1, wherein
- the positioning member faces the cover and directly contacts the cover, and
- the printed circuit board is between the support portion and the hole in a vertical direction orthogonal to the flat portion.

14. The electronic apparatus according to claim 1, wherein
- the base further includes:
    - screw holes extending from the flat portion of the base for a distance that is less than a height of the side wall above the flat portion, and
    - the printed circuit board is seated on an upper surface of the screw holes and attached to the base with screws in the screw holes.

* * * * *